(12) United States Patent
Majima

(10) Patent No.: US 7,823,047 B2
(45) Date of Patent: Oct. 26, 2010

(54) DEVICE AND METHOD FOR GENERATING A BASE BAND SIGNAL AND PROGRAM CAUSING COMPUTER TO EXECUTE THE METHOD

(75) Inventor: Taichi Majima, Yokohama (JP)

(73) Assignee: Kabushiki Kaisha Kenwood, Hachiouji-shi, Tokyo (JP)

( * ) Notice: Subject to any disclaimer, the term of this patent is extended or adjusted under 35 U.S.C. 154(b) by 1040 days.

(21) Appl. No.: 10/594,984

(22) PCT Filed: Mar. 30, 2005

(86) PCT No.: PCT/JP2005/006726

§ 371 (c)(1),
(2), (4) Date: Sep. 29, 2006

(87) PCT Pub. No.: WO2005/096576

PCT Pub. Date: Oct. 13, 2005

(65) Prior Publication Data

US 2008/0253475 A1 Oct. 16, 2008

(30) Foreign Application Priority Data

Mar. 31, 2004 (JP) ............................. 2004-107774

(51) Int. Cl.
*H03M 13/00* (2006.01)
(52) U.S. Cl. ...................... 714/774; 714/776; 375/275
(58) Field of Classification Search ................ 714/774, 714/776; 375/275
See application file for complete search history.

(56) References Cited

U.S. PATENT DOCUMENTS 5,727,030 A 3/1998 Miyashita (Continued)

FOREIGN PATENT DOCUMENTS

AU 50594/96 10/1996

(Continued)

OTHER PUBLICATIONS

International Search Report for PCT/JP2005/006726.

(Continued)

*Primary Examiner*—M. Mujtaba K Chaudry
(74) *Attorney, Agent, or Firm*—Eric J. Robinson, Robinson Intellectual Property Law Office, P.C.

(57) ABSTRACT

There is disclosed a base band signal generation device and others for processing transmission data so that a reception side can restored the data without recognizing whether the data has been subjected to a processing and transmitting the data with an appropriate efficiency corresponding to the communication quality. A transmission device T judges the communication quality of a transmission path L. When the communication quality is preferable, a four-value FSK symbol is generated from the bit of the most significant part of the encoded voice data and the bit of the least significant part. When the communication quality is not preferable, a four-value FSK symbol is generated from the bit of the most significant part of the encoded voice data and a redundant bit of "0". However, a symbol containing a redundant bit is set to the maximum value or the minimum value of the four values which the symbol value may have. Moreover, each bit of the encoded voice data has a value "0" when indicating that no component corresponding to the bit is present.

16 Claims, 9 Drawing Sheets

U.S. PATENT DOCUMENTS

| | | | | |
|---|---|---|---|---|
| 6,141,787 | A * | 10/2000 | Kunisa et al. | 714/769 |
| 6,512,748 | B1 | 1/2003 | Mizuki et al. | |
| 6,735,714 | B2 * | 5/2004 | Yamanaka et al. | 714/795 |
| 7,165,102 | B2 * | 1/2007 | Shah et al. | 370/328 |
| 7,194,047 | B2 * | 3/2007 | Strolle et al. | 714/795 |
| 7,526,710 | B2 * | 4/2009 | Sawaguchi | 714/784 |
| 2002/0075834 | A1 * | 6/2002 | Shah et al. | 370/337 |
| 2003/0081693 | A1 * | 5/2003 | Raghavan et al. | 375/298 |
| 2003/0134607 | A1 * | 7/2003 | Raghavan et al. | 375/219 |
| 2004/0024588 | A1 * | 2/2004 | Watson et al. | 704/200.1 |
| 2004/0057535 | A1 * | 3/2004 | Strolle et al. | 375/270 |

FOREIGN PATENT DOCUMENTS

| | | |
|---|---|---|
| CA | 2173785 | 10/1996 |
| DE | 696 33 313 | 10/1996 |
| EP | 0 738 053 | 10/1996 |
| JP | 08-288796 | 11/1996 |
| JP | 11-220762 | 8/1999 |
| JP | 2003-174485 | 6/2003 |
| KR | 0170011 | 3/1999 |
| WO | WO 03/049392 | 6/2003 |

OTHER PUBLICATIONS

International Preliminary Examination Report (Application No. PCT/JP2005/006726) dated Oct. 26, 2006.

* cited by examiner

DEVICE AND METHOD FOR GENERATING A BASE BAND SIGNAL AND PROGRAM CAUSING COMPUTER TO EXECUTE THE METHOD

TECHNICAL FIELD

The present invention relates to a technique for transmitting data at optimum efficiency corresponding to a communication quality of a transmission path, and, more particularly to a device and a method for generating a base band signal representing a sequence of multi-value symbols from given data.

BACKGROUND ART

As a technique for transmitting data at optimum efficiency corresponding to a communication quality of a transmission path, a method of decreasing a bit rate when the communication quality of the transmission path is low and increasing a bit rate when the communication quality is high is used.

Specifically, this method is, for example, a method of applying, in packet communication, FEC (Forward Error Correction) to data of an object to be transmitted when a communication quality does not satisfy a predetermined standard to thereby substantially decrease a bit rate and not applying FEC when the communication quality satisfies this standard to thereby substantially increase a bit rate. Such a technical method is described in, for example, prior art document: Association of Radio Industries and Business "Digital Automobile Telephone System Standard RCR STD-27 J version", May 30, 2002.

However, in the conventional technique, when FEC is applied to data, an arrangement of bits in a bit string constituting this data significantly changes. Therefore, a device on a side for receiving and restoring the data needs to know whether FEC is applied to the data. Therefore, it is necessary to separately transmit data indicating presence or absence of use of FEC in accordance with a complicated protocol that causes deterioration in transmission efficiency.

The invention has been devised in view of such a problem of the conventional technique and it is an object of the invention to provide a base band signal generating device, a base band signal generating method, and a program for processing data of a transmission object such that a reception side can restore the data without recognizing whether processing is applied to the data and for transmitting the data at proper efficiency corresponding to a communication quality.

DISCLOSURE OF THE INVENTION

In order to attain the object, a base band signal generating device according to a first aspect of the invention basically includes: base band signal generating means for converting data consisting of bit strings, in which at least a part of the bit strings is distinguished as a protection object portion, into a base band signal representing a sequence of symbols of four values; and communication quality judging means for judging whether a communication quality of an external transmission path for transmitting the base band signal has reached a predetermined standard.

The base band signal generating means operates, in a state in which it is judged that the communication quality of the transmission path has not reached the standard, to convert the data into the base band signal such that at least a part of the symbols belonging to the sequence of the symbols includes a bit belonging to the protection object portion and a predetermined redundant bit, and operates, in a state in which it is judged that the communication quality has reached the standard, to convert the data into the base band signal such that at least a part of the symbols belonging to the sequence of the symbols includes a bit belonging to the protection object portion and additional data converted into the base band signal together with the data.

A value of the redundant bit is set to a value that makes an instantaneous value of a point representing the symbol including the redundant bit in the base band signal always converge to a maximum value or a minimum value among four values to which the instantaneous value can converge.

A base band signal generating device according to a second aspect of the invention basically includes: base band signal generating means for converting data consisting of bit strings, in which at least a part of the bit strings is distinguished as a protection object portion, into a base band signal representing a sequence of symbols of multiple values; and communication quality judging means for judging whether a communication quality of an external transmission path for transmitting the base band signal has reached a predetermined standard.

The base band signal generating means operates, in a state in which it is judged that the communication quality of the transmission path has not reached the standard, to convert the data into the base band signal such that at least a part of the symbols belonging to the sequence of the symbols includes a bit belonging to the protection object portion and a predetermined redundant bit, and operates, in a state in which it is judged that the communication quality of the transmission path has reached the standard, to convert the data into the base band signal such that at least a part of the symbols belonging to the sequence of the symbols includes a bit belonging to the protection object portion and additional data converted into the base band signal together with the data.

A value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

A base band signal generating device according to a third aspect of the invention includes base band signal generating means and communication quality judging means as basic components in the same manner as the devices according to the first and the second aspects.

At least a part of the symbols belonging to the sequence of symbols includes a bit belonging to the protection object portion and a predetermined redundant bit or additional data converted into the base band signal together with the data. The base band signal generating means operates to convert the data into the base band signal such that a larger number of symbols include the additional data as a communication quality of the transmission path is higher.

A value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

In the base band signal generating devices according to the first, the second, and the third aspect, preferably, the data is constituted by a bit associated with a component that an object represented by the data can include and the bit takes a value identical with the value of the redundant bit when the component associated with the bit is not present in the object.

Preferably, the base band signal generating means operates to convert the data into the base band signal such that the sequence of the symbols represented by the base band signal includes a portion in which symbols including the redundant bit or the additional data and symbols not including the redundant bit and the additional data are alternately arranged.

Preferably, the data includes a part of a bit string obtained by encoding voice and the additional data includes another part of the bit string and/or the data includes a portion in which significance determined on the basis of a predetermined standard is the highest of the bit string and the additional data includes a portion in which the significance is the lowest of the bit string.

Preferably, the communication quality judging means includes means for measuring intensity of a signal transmitted on the transmission path and means for judging a communication quality of the transmission path on the basis of the intensity of the signal measured and/or at least a part of the data includes data for error detection of the protection object portion and the base band signal generating means operates, regardless of a judgment result of the communication quality of the transmission path, to convert the data into the base band signal such that at least a part of symbols belonging to the sequence of the symbols includes a bit constituting the data for error detection and the redundant bit.

The communication quality judging means may further include modulating means for generating a modulated wave using the base band signal generated by the base and signal generating means and sending the modulated wave to the transmission path.

It is also possible to grasp, in another aspect, the invention as a method of generating a base band signal. In that case, a method of generating a base band signal according to the first aspect of the invention includes: a base band signal generating step of converting data consisting of bit strings, in which at least a part of the bit strings is distinguished as a protection object portion, into a base band signal representing a sequence of symbols of four values; and a communication quality judging step of judging whether a communication quality of an external transmission path for transmitting the base band signal has reached a predetermined standard.

In the base band signal generating step, processing is performed for, in a state in which it is judged that the communication quality of the transmission path has not reached the standard, converting the data into the base band signal such that at least a part of the symbols belonging to the sequence of the symbols includes a bit belonging to the protection object portion and a predetermined redundant bit and, in a state in which it is judged that the communication quality of the transmission path has reached the standard, converting the data into the base band signal such that at least a part of the symbols belonging to the sequence of the symbols includes a bit belonging to the protection object portion and additional data converted into the base band signal together with the data.

A value of the redundant bit is set to a value that makes an instantaneous value of a point representing the symbol including the redundant bit always converge to a maximum value or a minimum value among four values to which the instantaneous value can converge.

Similarly, a base band signal generating method according to the second aspect of the invention includes: a base band signal generating step of converting data consisting of bit strings, in which at least a part of the bit strings is distinguished as a protection object portion, into a base band signal representing a sequence of symbols of multiple values; and a communication quality judging step of judging whether a communication quality of an external transmission path for transmitting the base band signal has reached a predetermined standard.

In the base band signal generating step, processing is performed for, in a state in which it is judged that the communication quality of the transmission path has not reached the standard, converting the data into the base band signal such that at least a part of the symbols belonging to the sequence of the symbols includes a bit belonging to the protection object portion and a predetermined redundant bit and, in a state in which it is judged that the communication quality of the transmission path has reached the standard, converting the data into the base band signal such that at least a part of the symbols belonging to the sequence of the symbols includes a bit belonging to the protection object portion and additional data converted into the base band signal together with the data.

A value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

A base band signal generating method according to the third aspect of the invention includes a base band signal generating step and a communication quality judging step in the same manner as the methods according to the first and the second aspects. At least a part of the symbols belonging to the sequence of symbols includes a bit belonging to the protection object portion and a predetermined redundant bit or additional data converted into the base band signal together with the data. In the base band signal generating step, processing is performed for converting the data into the base band signal such that a larger number of symbols include the additional data as a communication quality of the transmission path is higher.

A value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

In still another aspect, it is also possible to grasp the invention as a program for causing a computer to execute the base band signal generating method. In that case, for example, a program corresponding to the base band signal generating method according to the first aspect of the invention is a program for causing a computer to execute: a base band signal generating step of converting data consisting of bit strings, in which at least a part of the bit strings is distinguished as a protection object portion, into a base band signal representing a sequence of symbols of four values; and a communication quality judging step of judging whether a communication quality of an external transmission path for transmitting the base band signal has reached a predetermined standard.

In the base band signal generating step executed by the computer, processing is performed for, in a state in which it is judged that the communication quality of the transmission path has not reached the standard, converting the data into the base band signal such that at least a part of the symbols belonging to the sequence of the symbols includes a bit belonging to the protection object portion and a predetermined redundant bit and, in a state in which it is judged that the communication quality of the transmission path has reached the standard, converting the data into the base band signal such that at least a part of the symbols belonging to the sequence of the symbols includes a bit belonging to the protection object portion and additional data converted into the base band signal together with the data. A value of the redundant bit is set to a value that makes an instantaneous value of a point representing the symbol including the redundant bit in the base band signal always converge to a maximum value or a minimum value among four values to which the instantaneous value can converge.

Since the invention adopts the constitution described above, according to the invention, a reception side is capable of processing data of a transmission object such that the data can be restored without recognizing whether processing is applied to the data and capable of transmitting the data at proper efficiency corresponding to a communication quality.

BEST MODE FOR CARRYING OUT OF THE INVENTION

An embodiment of the invention will be hereinafter explained in detail with a voice transmitting and receiving system as an example and with reference to the drawings.

Figure 1:
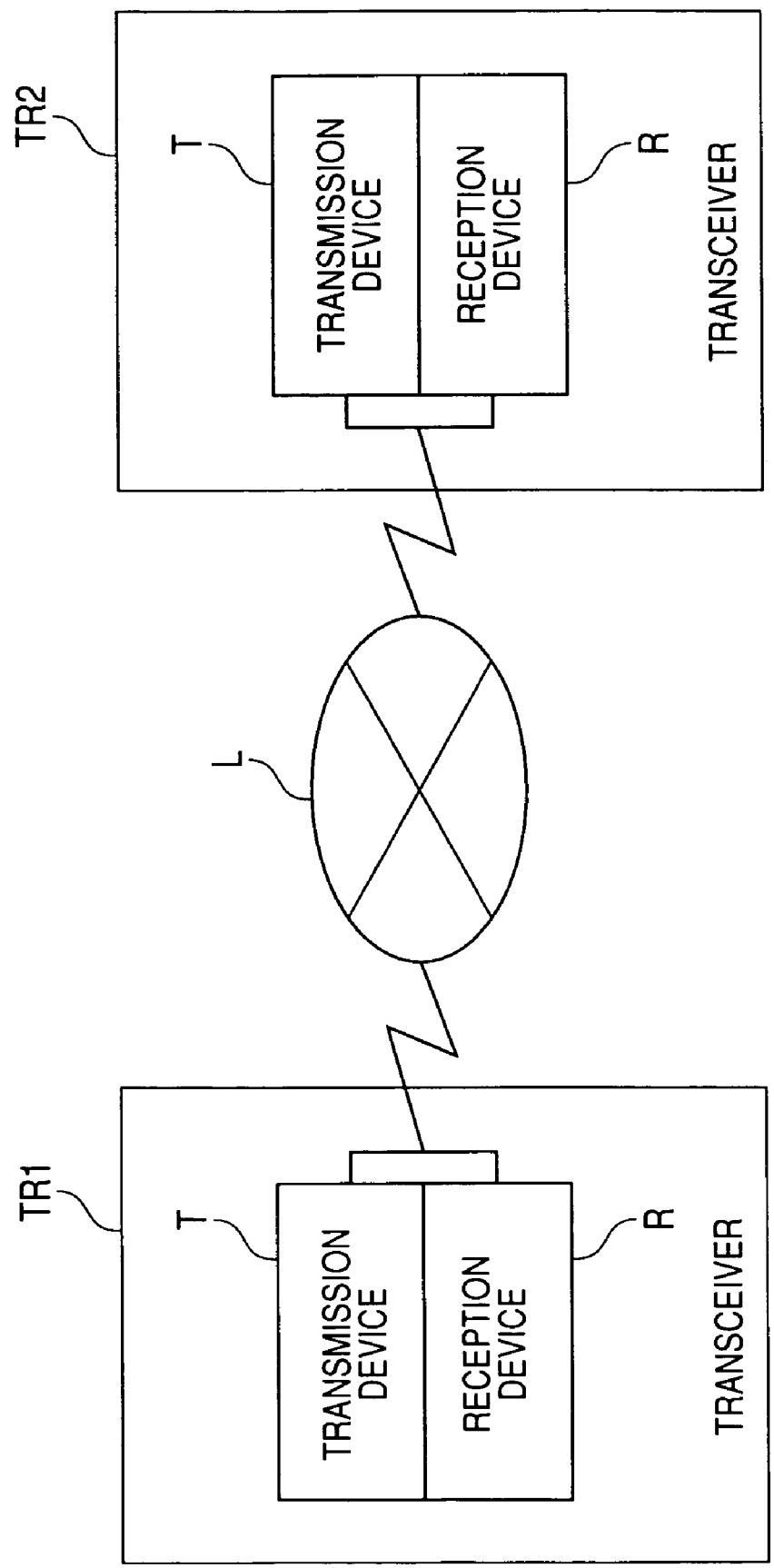
FIG. 1 is a block diagram showing a structure of a voice transmitting and receiving system according to an embodiment of the invention.

A structure of the voice transmitting and receiving system according to the embodiment of the invention is shown in FIG. 1. As shown in the figure, this voice transmitting and receiving system is constituted by transceivers TR1 and TR2. The transceivers TR1 and TR2 perform transmission and reception of voice with each other via an external transmission path L such as an external packet network.

The transceivers TR1 and TR2 have a substantially identical structure and include transmission devices T and reception devices R, respectively.

The transmission device T of the transceiver TR1 generates an FSK (Frequency Shift Keying) modulated wave representing voice and transmits the FSK modulated wave to the reception device R of the transceiver TR2. The reception device R of the transceiver TR2 receives this FSK modulated wave and reproduces the voice. Similarly, the transmission device T of the transceiver TR2 generates an FSK modulated wave representing voice and transmits the FSK modulated wave to the reception device R of the transceiver TR1. The reception device R of the transceiver TR1 receives this FSK modulated wave and reproduces the voice.

The transmission devices T of the transceivers TR1 and TR2 have a substantially identical structure. The reception devices R of the transceivers TR1 and TR2 also have a substantially identical structure.

However, each of the transceivers TR1 and TR2 has a structure for preventing an FSK modulated wave transmitted by the transmission device T of the transceiver itself from being received by the reception device R of the transceiver itself. Specifically, for example, it is conceivable to set a transmission frequency of the transmission device T and a reception frequency of the reception device R of the transceiver TR1 (or TR2) to be different from each other. Alternatively, the transceivers TR1 and TR2 affix identification codes of a transmission source and/or a destination to an FSK modulated wave transmitted by the transmission device T of each of the transceivers. On the other hand, the reception device R of each of the transceivers may treat, as an object for which voice is reproduced, only an FSK modulated wave with an identification code of the transceiver as a destination or an FSK modulated wave without an identification code of the transceiver as a transmission source. Alternatively, each of the transceivers TR1 and TR2 may have a publicly known mechanism for performing a function of PTT (Press To Talk) for stopping an operation of the reception device R of the transceiver receiving an FSK modulated wave while the transmission device T of the transceiver is transmitting an FSK modulated wave. (However, in this case, the transceivers TR1 and TR2 perform half-duplex communication with each other.)

Figure 2:
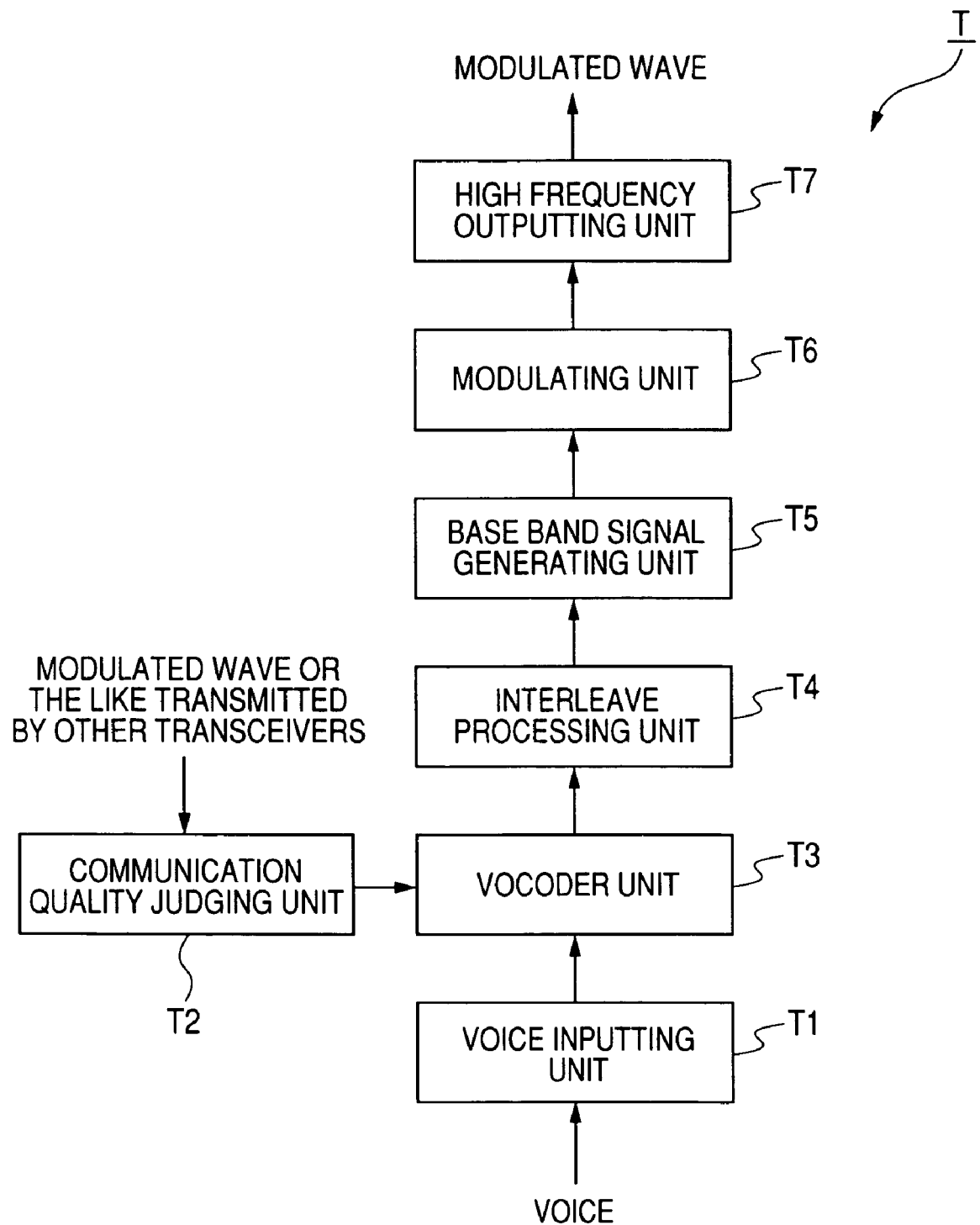
FIG. 2 is a block diagram showing a structure of a transmission device.

Each of the transmission devices T of the transceivers TR1 and TR2 is constituted by, as shown in FIG. 2, a voice inputting unit T1, a communication quality judging unit T2, a vocoder unit T3, an interleave processing unit T4, a base band signal generating unit T5, a modulating unit T6, and a high frequency outputting unit T7.

The voice inputting unit T1 is constituted by, for example, a microphone, an AF (Voice Frequency) amplifier, a sampler, an A/D (Analog-to-Digital) converter, and a logic circuit for frame generation.

For example, the voice inputting unit T1 collects voice and generates a voice signal of an analog format representing the voice, amplifies this voice signal, and subjects the voice signal to sampling and A/D conversion to thereby generate voice data of a digital format. The voice inputting unit T1 decomposes this voice data of the digital format into a sequence of plural frames and supplies the voice data to the vocoder unit T3.

The respective frames generated by the voice inputting unit T1 consist of voice data representing a waveform for one voice piece obtained by sectioning the voice collected by the voice inputting unit T1 at a fixed period (e.g., every 20 milliseconds).

The communication quality judging unit T2 judges a quality (a communication quality) of the transmission path L, generates communication quality data indicating a result of the judgment, and supplies the communication quality data to the vocoder unit T3.

Specifically, for example, the communication quality judging unit T2 measures, if the communication quality judging unit T2 belongs to the transceiver TR1, intensity of an FSK modulated wave sent by the transmission device T of the transceiver TR2, generates data indicating whether a result of the measurement exceeds a predetermined threshold as communication quality data, and supplies the data. In this case, the communication quality judging unit T2 only has to be constituted by, for example, a tuning circuit, a high frequency amplifier circuit, and a comparator. A tuning circuit and a high frequency amplifier constituting the reception device R may perform at least a part of the functions of the communication quality judging unit T2.

The communication quality judging unit T2 judges, in generating data indicating a result of the measurement of intensity of an FSK modulated wave as communication quality data, more specifically, for example, whether a measurement value of the intensity of the FSK modulated wave is (1) smaller than a predetermined threshold Th1, (2) equal to or larger than the threshold Th1 and smaller than a predetermined threshold Th2 larger than the threshold Th1, or (3) equal to or larger than the threshold Th2 and generates data indicating which of (1) to (3) the result of the judgment coincides with as communication quality data.

All of the vocoder unit T3, the interleave processing unit T4, and the base band signal generating unit T5 are constituted by a processor such as a DSP (Digital Signal Processor) or a CPU (Central Processing Unit), a memory that stores a program to be executed by this processor, and the like. A single processor may perform a part or all of the functions of the vocoder unit T3, the interleave processing unit T4, and the base band signal generating unit T5. The processor that performs a part or all of the functions of the vocoder unit T3, the interleave processing unit T4, and the base band signal generating unit T5 may further perform the function of the logic circuit for frame generation of the voice inputting unit T1.

When frames are supplied from the voice inputting unit T1, the vocoder unit T3 generates, for each of the frames supplied, vocoder output data described later using the frame and supplies the vocoder output data to the interleave processing unit T4 in a form with which it is possible to specify an order of the respective frames in a sequence of the frames. (Specifically, for example, the respective frames only have to be supplied one after another in accordance with this order or data indicating the order of the frames only has to be supplied together with the frames.)

Figure 3:
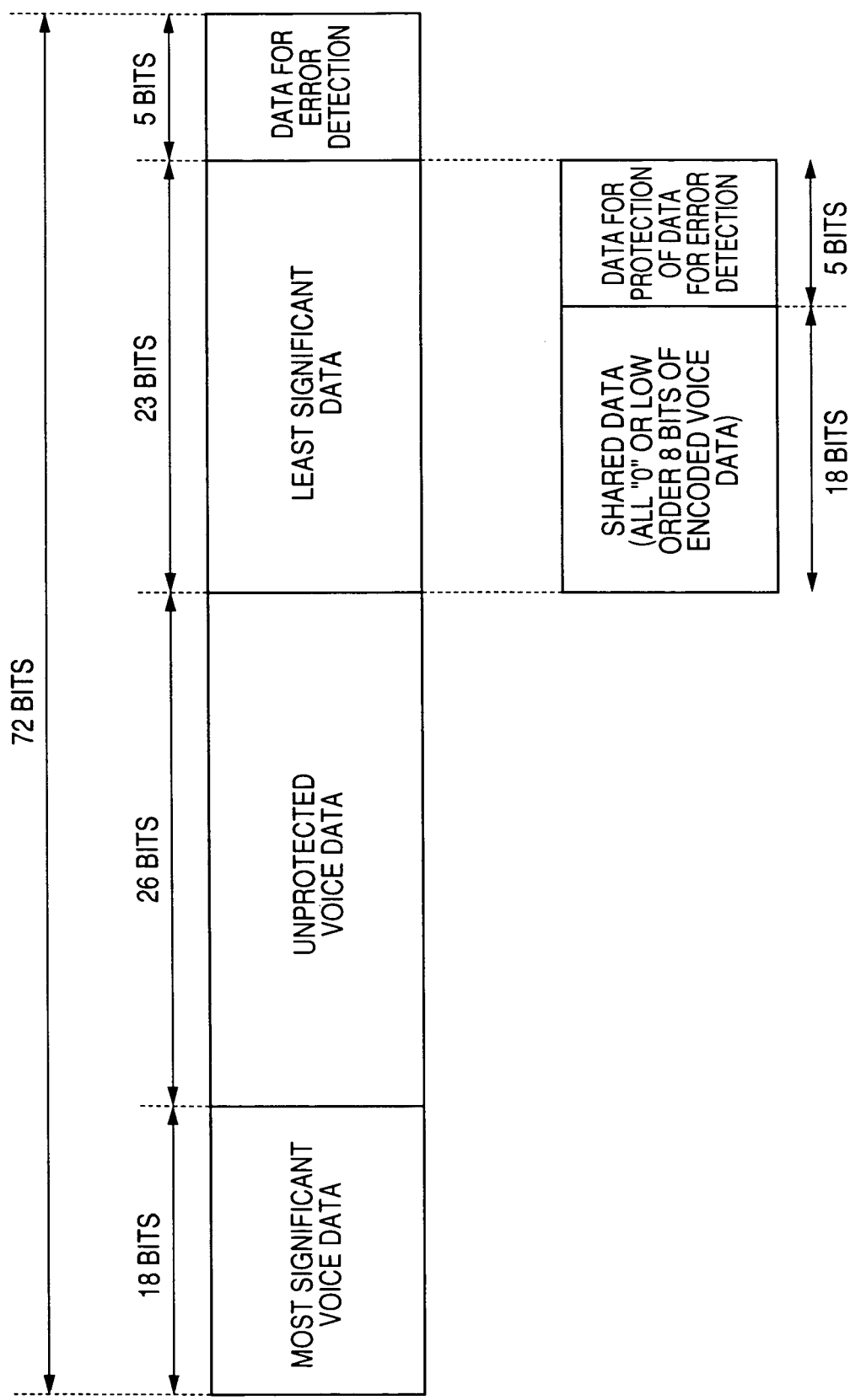
FIG. 3 is a diagram showing a data structure of vocoder output data.

The respective vocoder output data include, for example, as indicated by a data structure shown in FIG. 3, most significant voice data of 18 bits, unprotected voice data of 26 bits, least significant data of 23 bits, and data for error detection of 5 bits.

The most significant voice data of the vocoder output data is constituted by a portion of 18 bits with highest significance in the sense of hearing specified in accordance with a predetermined standard of data of 62 bits (hereinafter referred to as encoded voice data) obtained by encoding a voice piece represented by the frame used for generation of the vocoder output data. The unprotected voice data of the vocoder output data is constituted by a portion of 26 bits with second highest significance in the sense of hearing after the portion constituting the most significant voice data of the encoded voice data.

The encoded voice data is constituted by bits associated with components that voice can include (e.g., a voice pressure and a pitch). Each of these bits indicates, when the bit takes a value "0", a component associated with the bit is not substantially present in the voice piece represented by the encoded voice data including the bit.

A method with which the vocoder unit T3 encodes the voice piece needs to be a method capable of specifying, in accordance with a predetermined standard, significance in the sense of hearing of each bit constituting data obtained as a result of encoding and allotting the significance to any one of the most significant voice data, the unprotected voice data, and the other data. However, as long as such allotment is possible, a method with which the vocoder unit T3 encodes the voice piece is arbitrary. Specifically, the vocoder unit T3 only has to perform this encoding using a method such as liner predictive coding. In this case, the vocoder unit T3 only has to specify significance in the sense of hearing according to, for example, a publicly known standard described in the second separate volume p982 to 984 of a non-patent document 1.

On the other hand, the least significant data of the vocoder output data is constituted by shared data of 18 bits and data for protection of data for error detection of 5 bits. Of the data, all values of respective bits constituting the data for protection of data for error detection are "0".

On the other hand, a value of the shared data changes according to a communication quality of the transmission path L indicated by communication quality data supplied by the communication quality judging unit T2. Specifically, for example, when the communication quality has not reached a predetermined standard, the shared data is constituted by data of 18 bits in which all values are "0". On the other hand, when the communication quality has reached the standard, the shared data is constituted by, for example, a portion of 18 bits with lowest significance in the sense of hearing excluding the most significant voice data and the unprotected voice data included in the vocoder output data of the encoded voice data used for generation of the vocoder output data.

On the other hand, the data for error detection of the vocoder output data is constituted by a CRC (Cycle Redundancy Check) data for performing error detection for the most significant voice data obtained using the most significant voice data included in the vocoder output data.

Figure 4:
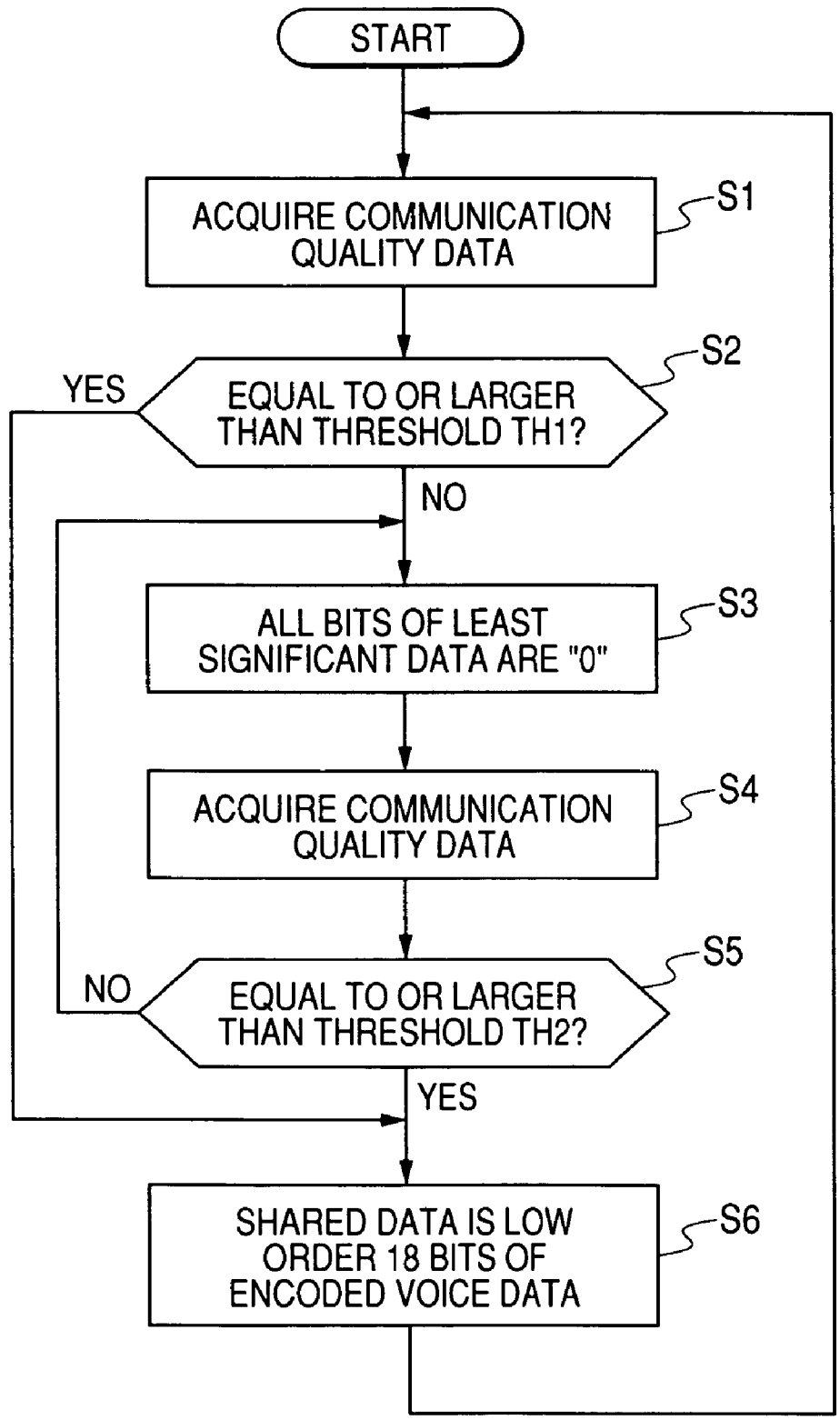
FIG. 4 is a flowchart showing a flow of processing for generating vocoder output data.

In order to set content of the vocoder output data, in particular, the least significant data as described above, specifically, the vocoder unit T3 creates vocoder output data according to, for example, a procedure shown in FIG. 4 and sequentially supplies the vocoder output data to the interleave processing unit T4.

First, the vocoder unit T3 acquires communication quality data supplied by the communication quality judging unit T2 (step S1 in FIG. 4) and judges whether a measurement value of intensity of an FSK modulated wave indicated by this communication quality data is equal to or larger than the threshold Th1 (i.e., corresponds to the condition of (2) or (3) above) (step S2). When it is judged that the measurement value of intensity of the FSK modulated wave is equal to or larger than the threshold Th1, the vocoder unit T3 shifts the processing to step S6.

On the other hand, when it is judged in step S2 that the measurement value of intensity of the FSK modulated wave is smaller than the threshold Th1, the vocoder unit T3 generates vocoder output data, in which all values of respective bits constituting least significant data are "0", using a leading frame of frames not used for creation of vocoder output data and supplies the vocoder output data to the interleave processing unit T4 (step S3).

Following the processing in step S3, the vocoder unit T3 acquires communication quality data from the communication quality judging unit T2 (step S4) and judges whether a measurement value of intensity of an FSK modulated wave indicated by this communication quality data is equal to or larger than the threshold Th2 (in other words, whether the measurement value corresponds to the condition of (3) above) (step S5). When it is judged in step S5 that the measurement value of intensity of the FSK modulated wave is smaller than the threshold Th2, the vocoder unit T3 returns the processing to step S3. On the other hand, when it is judged that the measurement value is equal to or larger than the threshold Th2, the vocoder unit T3 advances the processing to step S6.

In step S6, the vocoder unit T3 generates vocoder output data using a leading frame of frames not used for creation of vocoder output data, supplies the vocoder output data to the interleave processing unit T4 (step S6), and returns the processing to step S1. However, in step S6, a portion excluding the portion constituting the most significant voice data and the unprotected voice data of encoded voice data generated using the frame is treated as least significant data.

The interleave processing unit T4 applies interleave to the vocoder output data supplied from the vocoder unit T3. The interleave processing unit T4 supplies the vocoder output data interleaved (hereinafter referred to as interleaved frame) to the base band signal generating unit T5.

Figure 5:
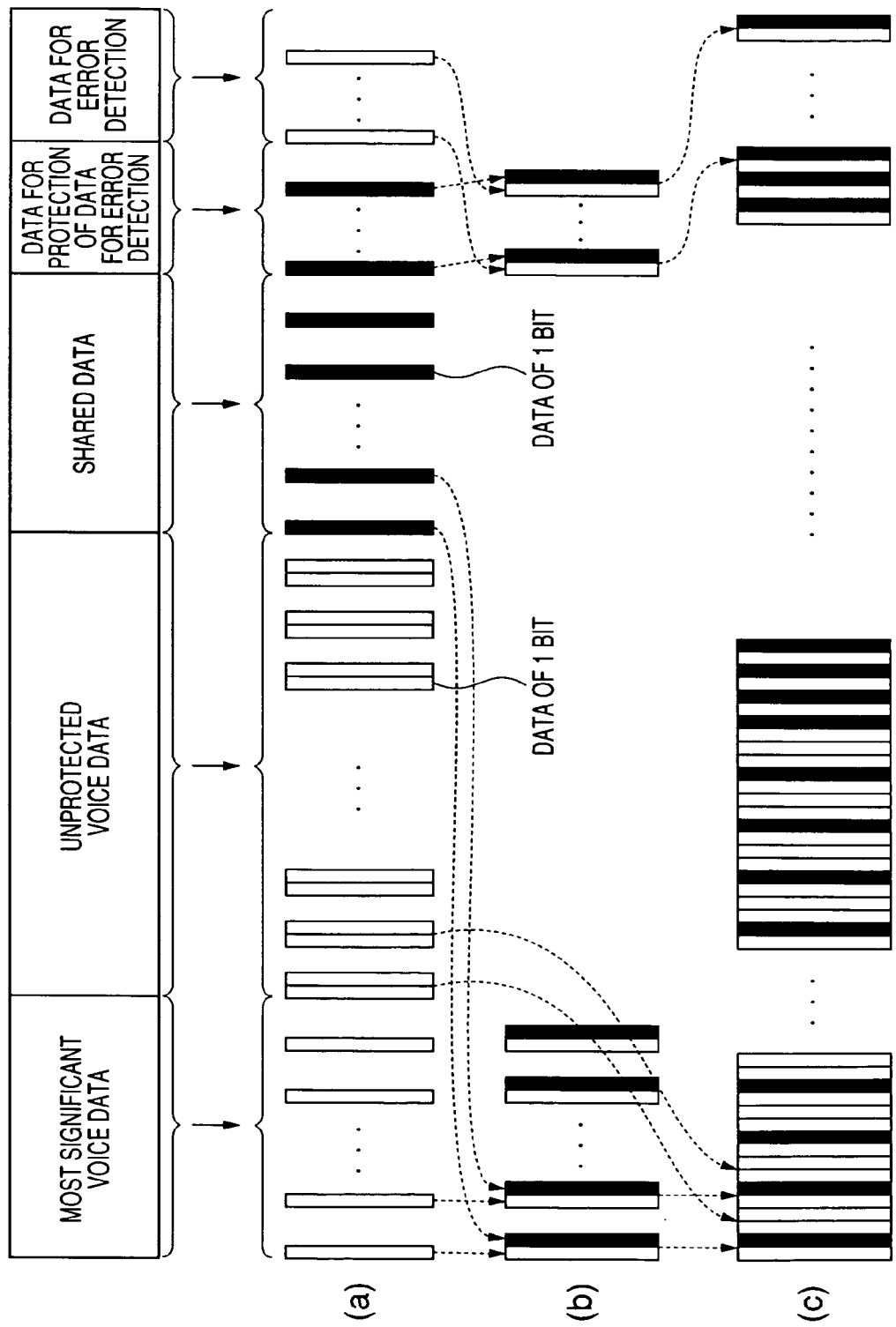
FIG. 5 is a diagram schematically showing processing for interleaving vocoder output data.

Specifically, when the vocoder output data is supplied from the vocoder unit T3, first, the interleave processing unit T4 generates data of 2 bits corresponding to symbols in FSK of four values on the basis of this vocoder output data. Specifically, for example, as shown in FIG. 5, the interleave processing unit T4 performs processing indicated as (A1) to (A3) below.

(A1) The interleave processing unit T4 generates eighteen data of 2 bits by combining respective bits constituting most significant voice data included in this vocoder output data and respective bits constituting shared data in a one to one relation. However, as shown in FIG. 5(b), all of these eighteen bits are combined such that the bits constituting the shared data are lower order bits.

(A2) The interleave processing unit T4 generates five data of 2 bits by combining respective bits constituting data for error detection included in this vocoder output data and respective bits constituting data for protection of data for error detection in a one to one relation. However, as shown in FIG. 5(b), all of these five data are combined such that the bits constituting the data for protection of data for error detection are lower order bits.

(A3) The interleave processing unit T4 decomposes unprotected voice data included in this vocoder output data into thirteen data of 2 bits as shown in FIG. 5(a).

The interleave processing unit T4 supplies the thirty-six 2-bit data in total obtained as a result of the processing in (A1) to (A3) to the base band signal generating unit T5 in a predetermined order including a portion in which the 2-bit data obtained in the processing of (A1) or (A2) and the 2-bit data obtained in the processing of (A3) are alternately arranged, for example, as shown in FIG. 5(C).

A low order one digit of all the 2-bit data, which the interleave processing unit T4 generates by performing the processing described above, is "0" when the 2-bit data are obtained from data for error detection and data for protection of data for error detection. When values of all bits of shared data are "0", a low order one digit of all the 2-bit data obtained from most significant voice data and shared data are "0".

On the other hand, a low order one digit of two-bit data obtained from unprotected voice data could be either "0" or "1".

When the interleaved frame is supplied from the interleave processing unit T4, the base band signal generating unit T5 converts this interleaved frame into a base band signal in a root Nyquist FSK of four values and supplies this base band signal to the modulating unit T6. The base band signal generating unit T5 may insert, for example, a signal serving as a marker for identifying a start point and an end point of a portion representing one interleaved frame in the base band signal.

Figure 6:
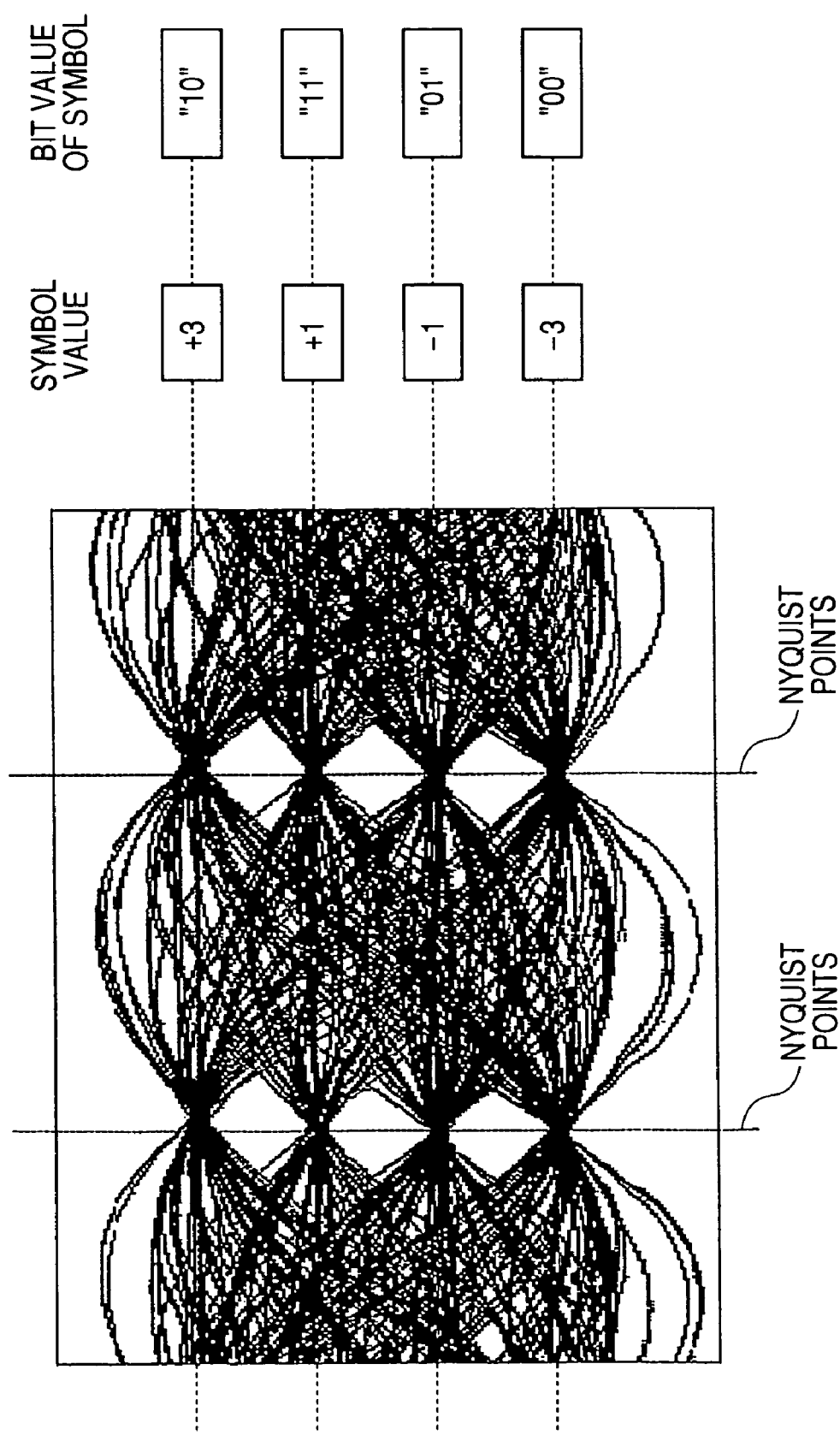
FIG. 6 is a graph showing an example of an eye pattern of a base band signal.

FIG. 6 is a diagram showing an example of an eye pattern of a base band signal generated by the base band signal generating unit T5. As shown in the figure, in this base band signal, an instantaneous value converges to any one of four values at a point of a fixed phase (a Nyquist point) in one symbol section (a section representing information for one symbol). When a second largest value is set as (+1), these four values (hereinafter referred to as symbol values) are arranged at equal intervals taking, for example, values of (+3), (+1), (−1), and (−3) in order from a largest one as shown in FIG. 6.

For example, as shown in FIG. 6, the base band signal generating unit T5 converts a symbol "00" included in the interleaved frame (i.e., 2-bit data having a value "00") into a symbol section with a symbol value (−3), converts a symbol "01" into a symbol section with a symbol value (−1), converts a symbol "11" into a symbol section with a symbol value (+1), and converts a symbol "10" into a symbol section with a symbol value (+3).

Conversion from the interleaved frame into a base band signal is performed in accordance with the rules described above. As a result, a symbol with a low order one digit of "0" is converted into a symbol section with a symbol value (−3) or (+3). Therefore, all symbols representing most significant voice data in an adverse state in which a communication quality does not satisfy the predetermined standard are converted into a symbol section with a symbol value (+3) or (−3). On the other hand, symbols representing unprotected voice data and most significant voice data in a state in which a communication quality is satisfactory can be converted into a symbol section that takes a symbol value of (+3), (+1), (−1), or (−3).

As it is evident from the above description, when conversion from the interleaved frame into a base band signal is performed in accordance with the rules described above, if these four kinds of symbols are arranged in order from one with a largest symbol value (or one with a smallest symbol value), the symbols form a sequence of gray codes (in other words, all hamming distances among symbols adjacent to one another in this arrangement are 1).

The modulating unit T6 is constituted by a publicly known frequency modulation circuit, an oscillator circuit that generates a carrier wave, and the like. The modulating unit T6 subjects a carrier wave to frequency modulation using a base band signal supplied from the base band signal generating unit T5 and supplies an FSK (a root Nyquist FSK) obtained to the high frequency outputting unit T7.

The modulating unit T6 may also be constituted by a processor, a memory that stores a program to be executed by this processor, and the like. A processor that performs a part or all of the functions of the voice inputting unit T1, the vocoder unit T3, the interleave processing unit T4, and the base band signal generating unit T5 may further perform the function of the modulating unit T6.

The high frequency outputting unit T7 is constituted by a high frequency amplifier circuit, an antenna, and the like. The high frequency outputting unit T7 amplifies a modulated wave supplied from the modulating unit T6 and sends the modulated wave to the transmission path L.

By performing the operations explained above, the transmission device T generates an FSK modulated wave having a root Nyquist characteristic, which represents voice collected by the transmission device T, and transmits the FSK modulated wave.

Symbols represented by a base band signal of this FSK modulated wave can be classified into symbols of a first kind representing a most significant portion of encoded voice data, symbols of a second kind representing data for error detection for the most significant portion of the encoded voice data, and symbols of a third kind representing portions other than the most significant portion of the encoded voice data. A symbol value of a symbol section representing the symbols of the second kind is a maximum value or a minimum value of four symbol values that can be taken by a symbol section of the base band signal. When a communication quality of the transmission path L does not satisfy the predetermined standard, a symbol value of a symbol section representing the symbols of the first kind is also a maximum value or a minimum value of four values that can be taken. Therefore, concerning only the symbols of the second kind (or the symbols of the first and the second kinds in the case in which a communication quality of the transmission path L does not satisfies the predetermined standard), a redundant bit is added to a bit forming the most significant portion of the encoded voice data or the data for error detection for the most significant portion. As a result, whereas there are two symbol values that can be taken, an interval of the symbol values is substantially enlarged. As a result, a signal to noise ratio is improved.

The transmission device T in the embodiment described above generates a base band signal such that the base band signal includes a portion in which symbol sections representing the symbols of the first kind and symbol sections representing the symbols of the third kind are alternately arranged. As a result, the symbols of the first kind with high significance are distributed in the base band signal. Therefore, even if a modulated wave transmitted is affected by phasing or the like, it is less likely that a large number of symbols of the first kind with high significance are collectively deleted.

When a communication quality of the transmission path L satisfies the predetermined standard, the symbols of the first kind are set to represent, in addition to a most significant portion of encoded voice data, content of a portion with lowest significance of this encoded voice data. Therefore, when a communication quality of the transmission path L is satisfactory, a bit rate of transmission of voice substantially increases and transmission is performed in a proper form corresponding to the communication quality.

When a communication quality of the transmission path L does not satisfy the predetermined standard, a value of a bit added to a most significant portion of encoded voice data in order to generate the symbols of the first kind ("0" in the example described above) is identical with a value in the case in which a bit constituting the encoded voice data indicates that a specific component is absent in a voice piece.

Therefore, a device that receives an FSK modulated wave transmitted by the transmission device T (e.g., the reception device R in this embodiment) may unconditionally regard the bit added to the most significant portion of the encoded voice data in order to generate the symbols of the first kind as representing content of a portion with lowest significance of the encoded voice data and use the bit for voice reproduction. Accordingly, it is unnecessary to judge what kind of information this bit represents.

Figure 7:
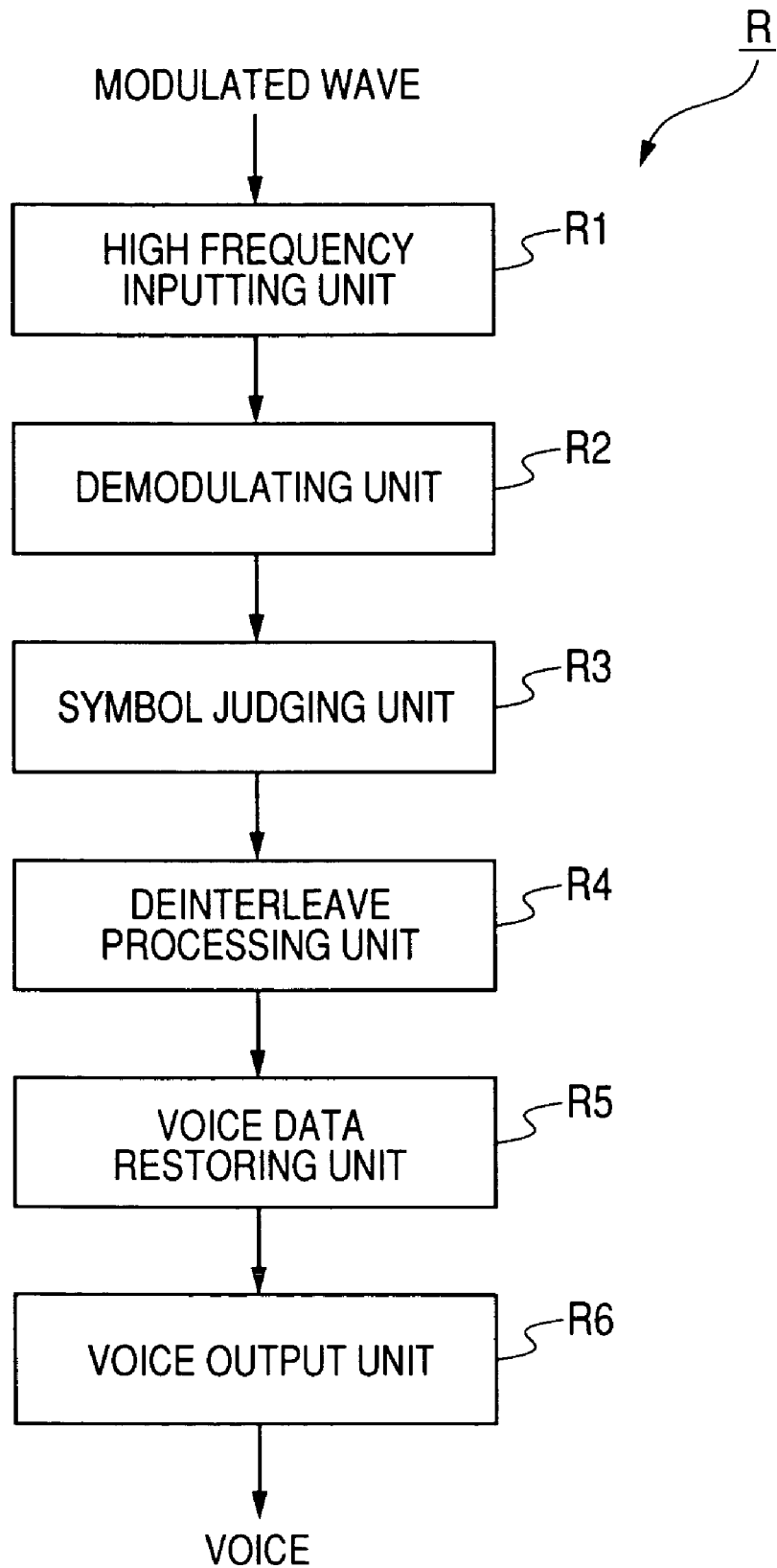
FIG. 7 is a block diagram showing a structure of a reception device.

Explaining the reception device R, each of the reception devices R of the transceivers TR1 and TR2 is constituted by, as shown in FIG. 7, a high frequency inputting unit R1, a demodulating unit R2, a symbol judging unit R3, a deinterleave processing unit R4, an voice data restoring unit R5, and a voice outputting unit R6.

The high frequency inputting unit R1 is constituted by an antenna, a tuning circuit, and a high frequency amplifier circuit. The high frequency inputting unit R1 receives an FSK modulated wave, which is sent by the transmission device T or the like to the transmission path L, from the transmission path L, amplifies the FSK modulated wave, and supplies the FSK modulated wave to the demodulating unit R2. One antenna provided in the transceiver TR1 or TR2 may perform both a function of the antenna of the high frequency inputting unit R1 of the transceiver and a function of the antenna of the high frequency outputting unit T7 of the transceiver.

The demodulating unit R2 is constituted by a publicly known detection circuit that detects a frequency modulated wave. The demodulating unit R2 detects an FSK modulated wave supplied from the high frequency inputting unit R1 to thereby restore a base band signal. The demodulating unit R2 supplies the base band signal restored to the symbol judging unit R3. The demodulating unit R2 may be constituted by a processor, a memory that stores a program to be executed by this processor, and the like.

All of the symbol judging unit R3, the deinterleave processing unit R4, and the voice data restoring unit R5 are constituted by a processor, a memory that stores a program to be executed by this processor, and the like. A single processor may perform a part or all of the functions of the symbol judging unit R3, the deinterleave processing unit R4, and the voice data restoring unit R5. A processor that performs a part or all of the functions of the demodulating unit R1 and the transmission device T may further perform a part or all of the functions of the symbol judging unit R3, the deinterleave processing unit R4, and the voice data restoring unit R5.

Figure 8:
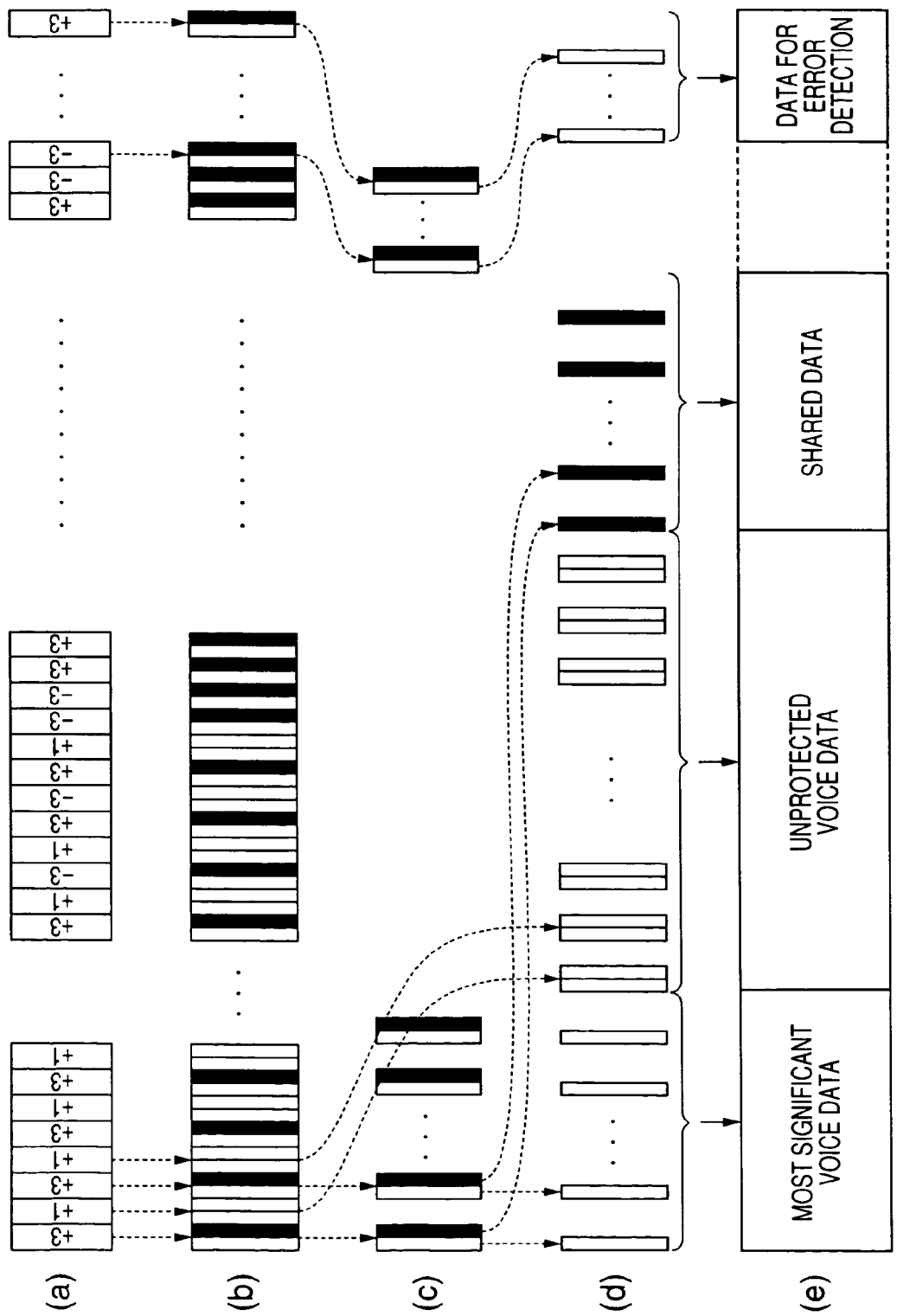
FIG. 8 is a diagram schematically showing processing for restoring vocoder output data from a base band signal.

As schematically shown in FIGS. 8(a) and 8(b), the symbol judging unit R3 judges, on the basis of instantaneous values at respective Nyquist points of a base band signal supplied from the demodulating unit R2, symbols represented by symbol sections including the respective Nyquist points. The symbol judging unit R3 reproduces, on the basis of a result of the judgment, data (FIG. 8(b)) corresponding to an interleaved frame generated by the interleave processing unit T4 of the transmission device T. The symbol judging unit R3 supplies the data reproduced to the deinterleave processing unit R4.

Specifically, for example, first, the symbol judging unit R3 judges, for each of the Nyquist points included in the base band signal supplied from the demodulating unit R2, whether an instantaneous value of the base band signal at the Nyquist point is equal to or larger than a first threshold (Th+), equal to or larger than a second threshold (Th0) and smaller than (Th+), equal to or larger than a third threshold (Th−) and smaller than (Th0), or smaller than (Th−).

Note that a value of (Th+) is larger than (+1) and smaller than (+3), a value of (Th0) is larger than (−1) and smaller than (+1), and a value of (Th−) is larger than (−3) and smaller than (−1). Therefore, specifically, a value of (Th+) only has to be, for example, (+2), a value of (Th0) only has to be, for example, (0), and a value of (Th−) only has to be, for example, (−2).

When it is judged that an instantaneous value of the base band signal at the Nyquist point is equal to or larger than (Th+), the symbol judging unit R3 judges that a symbol value of the symbol section including the Nyquist point is (+3) (FIG. 8(a)) and, therefore, the symbol section represents a symbol "10".

Similarly, when it is judged that the instantaneous value is equal to or larger than (Th0) and smaller than (Th+), the symbol judging unit R3 judges that a symbol value of the symbol section including the Nyquist point is (+1) and, therefore, the symbol section represents a symbol "11". When it is judged that the instantaneous value is equal to or larger than (Th−) and smaller than (Th0), the symbol judging unit R3 judges that a symbol value of the symbol section including the Nyquist point is (−1) and, therefore, the symbol section represents a symbol "01". When it is judged that the instantaneous value is smaller than (Th−), the symbol judging unit R3 judges that a symbol value of the symbol section including the Nyquist point is (−3) and, therefore, the symbol section represents a symbol "00".

When all the symbols of one interleaved frame are judged, the symbol judging unit R3 supplies a sequence of these symbols to the deinterleave processing unit R4 as data corresponding to one interleaved frame reproduced.

The deinterleave processing unit R4 restores, considering that the data supplied from the symbol judging unit R3 is interleaved frame, vocoder output data using the interleaved frame. The deinterleave processing unit R4 supplies the vocoder output data restored to the voice data restoring unit R5.

Specifically, when the data corresponding to the interleaved frame is supplied from the symbol judging unit R3, the deinterleave processing unit R4 performs processing of (B1) to (B5) described below as shown in FIGS. 8(b) to 8(e).

(B1) The deinterleave processing unit R4 specifies thirteen symbols including unprotected voice data of the respective symbols included in the interleaved frame supplied from the symbol judging unit R3 as unprotected voice data of 26 bits as a whole. For example, the deinterleave processing unit R4 only has to specify, on the basis of an order of each of the symbols in the interleaved frame, a type of data included in the symbol.

(B2) The deinterleave processing unit R4 separates eighteen symbols including most significant voice data of the respective symbols included in the interleaved frame into high order one bits and low order one bits, respectively. The deinterleave processing unit R4 specifies data of 18 bits consisting of eighteen data of the high order one bits as most significant voice data.

(B3) The deinterleave processing unit R4 specifies data of 18 bits consisting of eighteen data of the low order one bits separated by the processing in (B2) as shared data of least significant data (note that the shared data is data consisting of a portion excluding the unprotected voice data specified by the processing of (a) and the most significant voice data specified by the processing of (B2) of one encoded voice data).

(B4) The deinterleave processing unit R4 abandons low order one bits of five symbols including data for error detection of the respective symbols included in the interleaved frame and specifies data of 5 bits consisting of five data of the remaining high order one bits as data for error detection.

(B5) The deinterleave processing unit R4 associates the most significant voice data, the unprotected voice data, the least significant data, and the data for error detection specified by the processing of (B1) to (B4) with one another and supplies the data to the voice data restoring unit R5 as data corresponding to vocoder output data.

The voice data restoring unit R5 acquires the data corresponding to vocoder output data supplied from the deinterleave processing unit R4, detects a wrong bit in the most significant voice data included in this data using the data for error detection included in the data, and applies predetermined bad frame masking processing to the bit detected.

Specifically, the bad frame masking processing only has to be, for example, processing for changing a wrong bit to the same value as a value of a bit immediately before the bit or in a position satisfying a predetermined condition. Alternatively, the bad frame masking processing may be processing for changing a value of a wrong bit to a value interpolating bits before and behind the bit in accordance with a predetermined rule (e.g., Lagrange's interpolation). Alternatively, the bad frame masking processing may be processing for changing a value of a wrong bit to a value indicating that a component associated with the bit is absent or abandoned (e.g. "0" in an example of vocoder output data generated by the transmission device T) and other predetermined values.

The voice data restoring unit R5 converts encoded voice data constituted by the most significant voice data, the unprotected voice data, and the least significant data included in the vocoder output data, for which error detection of the most significant voice data (and, when an error is detected, the bad frame masking processing) is completed, into voice data of a digital format representing a waveform of voice indicated by the encoded voice data with a publicly known method and supplies the voice data to the voice outputting unit R6.

As the method of converting encoded voice data into a voice signal, a method of, for example, storing a lookup table describing a correspondence relation between a code constituting the encoded voice data and the voice data and a database of the voice data in advance, specifying voice data corresponding to the code in the encoded voice data with reference to this lookup table, and reading out the voice data specified from the database to combine the voice data each other is conceivable.

As described above, a bit constituting one bit together with a bit in most significant voice data is a bit forming a portion with lowest significance of encoded voice data or a bit having a value indicating that a specific component in a voice piece is absent. Therefore, the reception device R may unconditionally regard the data specified by the processing of (B3) as representing content of the portion with lowest significance of the encoded voice data. In other words, it is unnecessary to distinguish what kind of data this data is.

The voice outputting unit R6 is constituted by, for example, a D/A (Digital-to-Analog) converter, an AF amplifier, and a speaker.

When voice data of a digital format is supplied from the voice data restoring unit R5, the voice outputting unit R6 generates a voice signal of an analog format by, for example, subjecting this voice data to D/A conversion. The voice outputting unit R6 amplifies this voice signal and drives the speaker with the voice signal amplified to thereby reproduce voice represented by this voice signal.

By performing the operations explained above, the reception device R receives an FSK modulated wave transmitted by the transmission device T or the like and reproduces voice represented by this FSK modulated wave.

In the FSK modulated wave transmitted by the transmission device T, as described above, there are two symbol values that a symbol representing data for error detection of a most significant portion of encoded voice data (when a communication quality of the transmission path L does not satisfy the predetermined standard, a symbol representing the most significant portion) can take. On the other hand, an interval of symbol values is substantially enlarged. Therefore, the reception device R can satisfactorily restore these symbols. When a communication quality of the transmission path L satisfies the predetermined standard, this FSK modulation further represents content of a portion with lowest significance of this encoded voice data. The reception device R can also use this portion for reproduction of voice.

Figure 9:
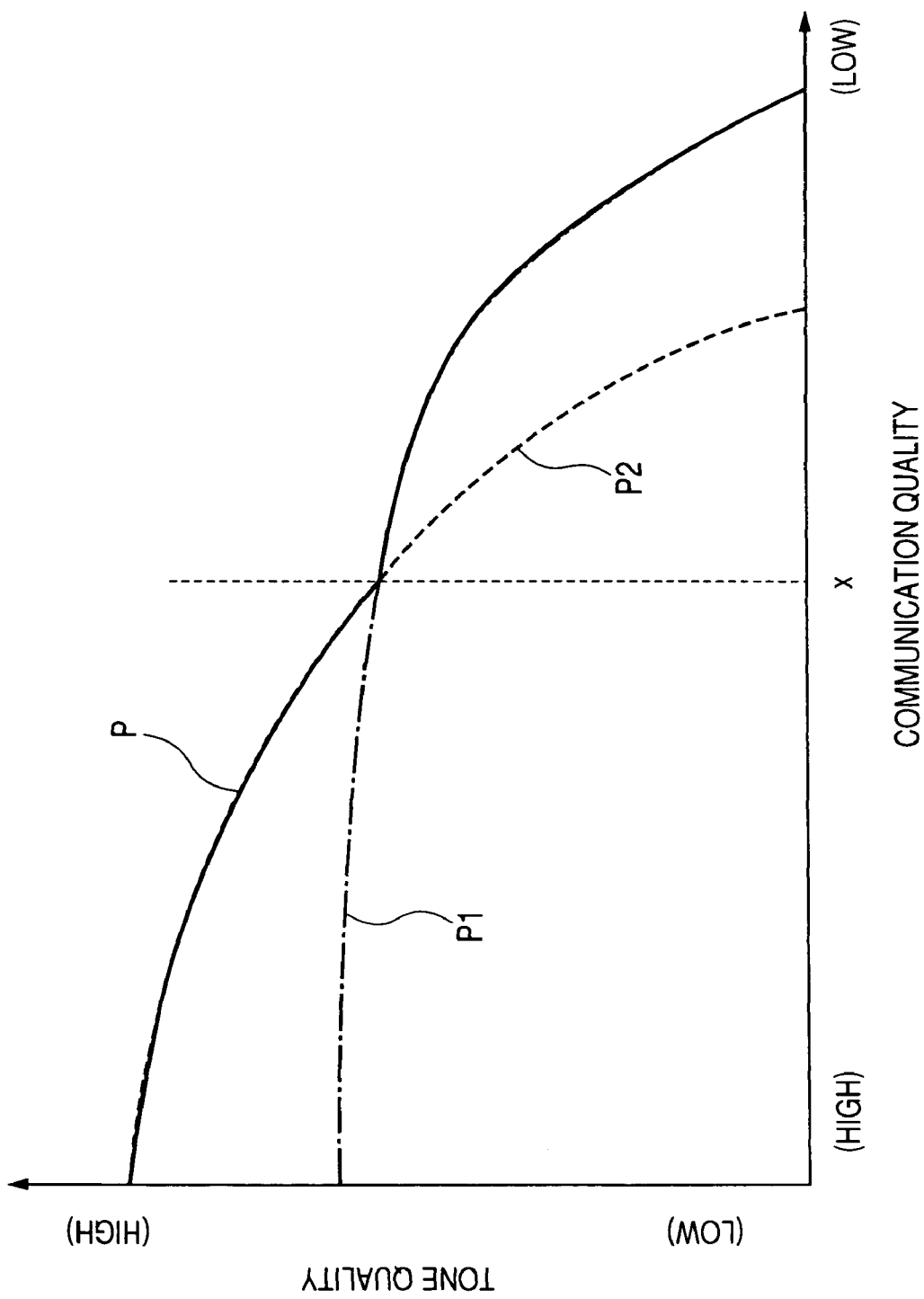
FIG. 9 is a graph showing a relation between a communication quality and a tone quality in the case in which the reception device in FIG. 7 receives a modulated wave transmitted by the transmission device in FIG. 2 and reproduces voice.

Therefore, when the reception device R receives an FSK modulated wave transmitted by the transmission device T or the like and reproduces voice, for example, a characteristic of voice indicated as a graph P in FIG. 9 is obtained. A graph P1 in FIG. 9 is a graph showing a relation between a communication quality and a tone quality in the case in which a most significant portion of encoded voice data and data for error detection for the encoded voice data are uniformly converted into symbols with a symbol value of (+3) or (−3) according to the procedure described above for adding a redundant bit regardless of a communication quality. A graph P2 is a graph showing a relation between a communication quality and a tone quality in the case in which a bit forming a most significant portion of encoded voice data and a bit forming a portion with lowest significance are uniformly represented as one symbol according to the procedure described above regardless of a communication quality.

(FIG. 9 illustrates a case in which intensity of an FSK modulated wave measured by the communication quality judging unit T2 is used as a scale of a communication quality and the thresholds Th1 and Th2 described above are in a relation of Th1=Th2=x.)

As it is seen from FIG. 9, when a communication quality of the transmission path L is lower than x, the reception device R reproduces voice with a characteristic of the graph P1 more excellent than a characteristic of the graph P2 in this case. On the other hand, when a communication quality of the transmission path L is higher than x, the reception device R reproduces voice with the characteristic of the graph P2 more excellent than the characteristic of the graph P1 in this case. In this way, this voice transmitting and receiving system performs transmission of voice with the method with which an optimum tone quality is obtained according to a communication quality.

A structure of this voice transmitting and receiving system is not limited to the structure described above.

For example, the portions constituted by the processors of the respective portions of the transmission device T and the reception device R may be constituted by dedicated electronic circuits instead of the processors. The number of bits of the various data described above representing voice and the data for error detection is arbitrary.

When a communication quality of the transmission path L satisfies the predetermined standard, like shared data, data for protection of data for error correction may be constituted by a bit forming a portion with lowest significance of encoded voice data.

Rules under which the vocoder unit T3 encodes voice are also arbitrary. The vocoder unit T3 may further apply processing such as FEC (Forward Error Correction) to encoded voice. The data for error correction does not always have to be formed of a CRC code and may be created by check sum, a parity code, or other arbitrary methods. Alternatively, an error correction code may be used instead of the data for error detection.

The vocoder unit T3 described above changes the number of bits of a component of voice encoded data included in the shared data in two stages in such a manner as to set, if a communication quality of the transmission path L indicated by communication quality data has reached the predetermined standard, the number of bits to be the same as the number of bits of most significant voice data and set, if a communication quality of the transmission path L has not reached the predetermined standard, the number of bits to 0.

However, the vocoder unit T3 may change the number of bits of a component of voice encoded data included in the shared data in three or more stages such that the number of bits increases as a communication quality of the transmission path L is higher (e.g., in the example described above, as intensity of an FSK modulated wave indicated by communication quality data is larger). In this case, the vocoder unit T3 only has to set a value of the remaining bits not representing a component of the voice encoded data of the shared data to a value indicating absence of a specific component of voice ("0" in the example described above).

Data of an object to be transmitted does not always have to represent voice but is arbitrary as long as the data is data represented as a sequence of codes. Therefore, the data may be, for example, data representing an image. The vocoder unit T3 may determine which part of data of the transmission object is treated as a most significant portion (or a portion with lowest significance) in accordance with an arbitrary standard.

The voice inputting unit T1 may acquire data of an object to be transmitted with an arbitrary method. For example, the voice inputting unit T1 may include a USB (Universal Serial Bus) or a serial interface circuit of IEEE1394, Ethernet (registered trademark), or the like and acquire data, which is serially transmitted from the outside, via the serial interface or the like. Alternatively, the voice inputting unit T1 may include a recording medium drive device such as a CD (Compact Disc)-ROM (Read Only Memory) drive and read data of an object to be transmitted from a recording medium having the data recorded therein.

A base band signal may represent symbols exceeding four values. A symbol value of symbols obtained by adding a redundant bit to data of a transmission object does not always have to be a maximum value or a minimum value of plural values that can be taken. A minimum value of a difference between symbol values of two symbols different from each other only has to be larger than a minimum value in the case in which symbols are generated without adding a redundant bit.

Symbols represented by the base band signal do not always have to be defined to form a sequence of gray codes when the symbols are arranged in an order from one with a largest symbol value (or an order from one with a smallest symbol value).

A modulated wave transmitted and received between the transmission device T and the reception device R does not always have to be an FSK modulated wave having a root Nyquist characteristic. The modulated wave may have, for example, a Gaussian characteristic or other arbitrary characteristics. This modulated wave only has to represent a base band signal generated by the base band signal generating unit T5 in some form. Therefore, the modulated wave may be, for example, a PSK (Phase Shift Keying) modulated wave.

A method with which the communication quality judging unit T2 judges a communication quality of the transmission path L is arbitrary. For example, the communication quality judging unit T2 may acquire data transmitted on the transmission path L, specify a parameter such as an EVM (Error Vector Magnitude), a BER (Bit Error Rate), or an arbitrary parameter indicating a quality of data, and create communication quality data on the basis of this parameter.

The symbol judging unit R3 of the reception device R may judge, for a section representing symbols added with a redundant bit, which one of two values (a maximum value and a minimum value of four values that can originally be taken) a symbol value of the section is.

The transmission path L does not always have to include a packet network. The transceivers TR1 and TR2 may directly perform transmission and reception of a modulated waveform each other (in other words, the transmission path L may be a space in which an electromagnetic wave propagates or may consist of a communication line directly connecting the transceiver TR1 and the transceiver TR2). Alternatively, the transmission path L may be constituted by a network such as the Internet.

The embodiment of the invention has been explained. It is possible to realize the base band signal generating device according to the invention using a usual computer system without depending on a dedicated system.

For example, it is possible to constitute the transmission device T, which executes the processing described above, by installing a program for causing a computer including a microphone, an AF amplifier, a sampler, an A/D converter, and a higher frequency amplifier circuit to execute the operations of the transmission device T from a recording medium (a CD-ROM, a flexible disk, etc.) having the program stored therein. For example, it is possible to constitute the reception device R, which executes the processing described above, by installing a program for causing a computer including a speaker, an AF amplifier, a D/A converter, and a high frequency amplifier circuit to execute the operations of the reception device R from a recording medium (a CD-ROM, a flexible disk, etc.) having the program stored therein. One computer may perform both at least a part of the functions of the transmission device T and at least a part of the functions of the reception device R.

It is also possible that, for example, these programs are uploaded to a BBS of a communication line and distributed via the communication line. It is also possible that a carrier wave is modulated by signals representing these programs, a modulated wave obtained is transmitted, and a device having received this modulated wave demodulates the modulated wave to restore the program.

It is possible to execute the processing described above by starting these programs and executing the programs in the same manner as other application programs under the control of an OS.

When the OS shares a part of the processing or when the OS constitutes a part of one element of the invention, programs excluding that part may be stored in a recording medium. Even in this case, in the invention, a program for executing respective functions or steps executed by the computer is stored in the recording medium.

INDUSTRIAL APPLICABILITY

According to the invention, there is provided a base band signal generating device that operates to process data of a transmission object such that a reception side can restore the data without recognizing whether processing is applied to the data and to transmit the data at proper efficiency corresponding to a communication quality.

This base band signal generating device of the invention can be widely used in a voice communication system.

The invention claimed is:

1. A base band signal generating device comprising:
base band signal generating means for converting data consisting of bit strings, in which at least a part of the bit strings is distinguished as a protection object portion, into a base band signal representing a sequence of symbols of four values; and
communication quality judging means for judging whether a communication quality of an external transmission path for transmitting the base band signal has reached a predetermined standard,
wherein the base band signal generating means operates, in a state in which it is judged that the communication quality of the transmission path has not reached the standard, to convert the data into the base band signal such that at least a part of the symbols belonging to the sequence of the symbols includes a bit belonging to the protection object portion and a predetermined redundant bit, and operates, in a state in which it is judged that the communication quality of the transmission path has reached the standard, to convert the data into the base band signal such that at least a part of the symbols belonging to the sequence of the symbols includes a bit belonging to the protection object portion and additional data converted into the base band signal together with the data, and
wherein a value of the redundant bit is set to a value that makes an instantaneous value of a point representing the symbol including the redundant bit in the base band signal always converge to a maximum value or a minimum value among four values to which the instantaneous value can converge.

2. A base band signal generating device comprising:
base band signal generating means for converting data consisting of bit strings, in which at least a part of the bit strings is distinguished as a protection object portion, into a base band signal representing a sequence of symbols of multiple values; and
communication quality judging means for judging whether a communication quality of an external transmission path for transmitting the base band signal has reached a predetermined standard,
wherein the base band signal generating means operates, in a state in which it is judged that the communication quality of the transmission path has not reached the standard, to convert the data into the base band signal such that at least a part of the symbols belonging to the sequence of the symbols includes a bit belonging to the protection object portion and a predetermined redundant bit, and operates, in a state in which it is judged that the communication quality of the transmission path has reached the standard, to convert the data into the base band signal such that at least a part of the symbols belonging to the sequence of the symbols includes a bit belonging to the protection object portion and additional data converted into the base band signal together with the data, and
wherein a value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

3. A base band signal generating device comprising:
base band signal generating means for converting data consisting of bit strings, in which at least a part of the bit strings is distinguished as a protection object portion, into a base band signal representing a sequence of symbols of multiple values; and
communication quality judging means for judging whether a communication quality of an external transmission path for transmitting the base band signal has reached a predetermined standard,
wherein at least a part of the symbols belonging to the sequence of symbols includes a bit belonging to the protection object portion and a predetermined redundant bit or additional date converted into the base band signal together with the data,
wherein the base band signal generating means operates to convert the data into the base band signal such that a larger number of symbols include the additional data as a communication quality of the transmission path is higher, and wherein a value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

4. The base band signal generating device according to claim 1, 2, or 3, wherein the data is constituted by a bit associated with a component that an object represented by the data can include and the bit takes a value identical with the value of the redundant bit when the component associated with the bit is not present in the object.

5. The base band signal generating device according to claim 1, 2, or 3, wherein the base band signal generating means operates to convert the data into the base band signal such that the sequence of the symbols represented by the base band signal includes a portion in which symbols including the redundant bit or the additional data and symbols not including the redundant bit and the additional data are alternately arranged.

6. The base band signal generating device according to claim 1, 2, or 3, wherein the data includes a part of a bit string obtained by encoding voice and the additional data includes another part of the bit string.

7. The base band signal generating device according to claim 1, 2, or 3, wherein the data includes a portion in which significance determined on the basis of a predetermined standard is the highest of the bit string and the additional data includes a portion in which the significance is the lowest of the bit string.

8. The base band signal generating device according to claim 1, 2, or 3, wherein the communication quality judging means includes:
means for measuring intensity of a signal transmitted on the transmission path; and
means for judging a communication quality of the transmission path on the basis of the intensity of the signal measured.

9. The base band signal generating device according to claim 1, 2, or 3, wherein at least a part of the data includes data for error detection of the protection object portion and the base band signal generating means operates, regardless of a judgment result of the communication quality of the transmission path, to convert the data into the base band signal such that at least a part of symbols belonging to the sequence of the symbols includes a bit constituting the data for error detection and the redundant bit.

10. The base band signal generating device according to claim 1, 2, or 3, further comprising modulating means for generating a modulated wave using the base band signal generated by the base and signal generating means and sending the modulated wave to the transmission path.

11. A base band signal generating method, the method comprising the steps of:
generating a base band signal by converting data consisting of bit strings, in which at least a part of the bit strings is distinguished as a protection object portion, into the base band signal representing a sequence of symbols of four values; and
judging whether a communication quality of an external transmission path for transmitting the base band signal has reached a predetermined standard, characterized in that
in the base band signal generating step, processing is performed for, in a state in which it is judged that the communication quality of the transmission path has not reached the standard, converting the data into the base band signal such that at least a part of the symbols belonging to the sequence of the symbols includes a bit belonging to the protection object portion and a predetermined redundant bit and, in a state in which it is judged that the communication quality of the transmission path has reached the standard, converting the data into the base band signal such that at least a part of the symbols belonging to the sequence of the symbols includes a bit belonging to the protection object portion and additional data converted into the base band signal together with the data, and
a value of the redundant bit is set to a value that makes an instantaneous value of a point representing the symbol including the redundant bit in the base band signal always converge to a maximum value or a minimum value among four values to which the instantaneous value can converge.

12. A base band signal generating method, the method comprising the steps of:
generating a base band signal by converting data consisting of bit strings, in which at least a part of the bit strings is distinguished as a protection object portion, into a base band signal representing a sequence of symbols of multiple values; and
judging whether a communication quality of an external transmission path for transmitting the base band signal has reached a predetermined standard,
in the base band signal generating step, processing is performed for, in a state in which it is judged that the communication quality of the transmission path has not reached the standard, converting the data into the base band signal such that at least a part of the symbols belonging to the sequence of the symbols includes a bit belonging to the protection object portion and a predetermined redundant bit and, in a state in which it is judged that the communication quality of the transmission path has reached the standard, converting the data into the base band signal such that at least a part of the symbols belonging to the sequence of the symbols includes a bit belonging to the protection object portion and additional data converted into the base band signal together with the data, and
a value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

13. A base band signal generating method, the method comprising the steps of:
generating a base band signal by converting data consisting of bit strings, in which at least a part of the bit strings is distinguished as a protection object portion, into the base band signal representing a sequence of symbols of multiple values; and
a communication quality judging step of judging a communication quality of an external transmission path for transmitting the base band signal,
wherein at least a part of the symbols belonging to the sequence of symbols includes a bit belonging to the protection object portion and a predetermined redundant bit or additional data converted into the base band signal together with the data, in the base band signal generating step, processing is performed for converting the data into the base band signal such that a larger number of symbols include the additional data as a communication quality of the transmission path is higher, and a value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

14. A program for causing a computer to execute the steps of:

generating a base band signal by converting data consisting of bit strings, in which at least a part of the bit strings is distinguished as a protection object portion, into a base band signal representing a sequence of symbols of four values; and judging whether a communication quality of an external transmission path for transmitting the base band signal has reached a predetermined standard, in the base band signal generating step, processing is performed for, in a state in which it is judged that the communication quality of the transmission path has not reached the standard, converting the data into the base band signal such that at least a part of the symbols belonging to the sequence of the symbols includes a bit belonging to the protection object portion and a predetermined redundant bit and, in a state in which it is judged that the communication quality of the transmission path has reached the standard, converting the data into the base band signal such that at least a part of the symbols belonging to the sequence of the symbols includes a bit belonging to the protection object portion and additional data converted into the base band signal together with the data, and a value of the redundant bit is set to a value that makes an instantaneous value of a point representing the symbol including the redundant bit in the base band signal always converge to a maximum value or a minimum value among four values to which the instantaneous value can converge.

15. A program for causing a computer to execute the steps of:

generating a base band signal by converting data consisting of bit strings, in which at least a part of the bit strings is distinguished as a protection object portion, into a base band signal representing a sequence of symbols of multiple values; and judging whether a communication quality of an external transmission path for transmitting the base band signal has reached a predetermined standard, in the base band signal generating step, processing is performed for, in a state in which it is judged that the communication quality of the transmission path has not reached the standard, converting the data into the base band signal such that at least a part of the symbols belonging to the sequence of the symbols includes a bit belonging to the protection object portion and a predetermined redundant bit and, in a state in which it is judged that the communication quality of the transmission path has reached the standard, converting the data into the base band signal such that at least a part of the symbols belonging to the sequence of the symbols includes a bit belonging to the protection object portion and additional data converted into the base band signal together with the data, and a value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

16. A program for causing a computer to execute the steps of:

generating a base band signal by converting data consisting of bit strings, in which at least a part of the bit strings is distinguished as a protection object portion, into a base band signal representing a sequence of symbols of multiple values; and judging a communication quality of an external transmission path for transmitting the base band signal, wherein at least a part of the symbols belonging to the sequence of symbols includes a bit belonging to the protection object portion and a predetermined redundant bit or additional data converted into the base band signal together with the data, in the base band signal generating step, processing is performed for converting the data into the base band signal such that a larger number of symbols include the additional data as a communication quality of the transmission path is higher, and a value of the redundant bit is set to a value that makes a minimum value of a difference between instantaneous values of two points representing two symbols including the redundant bit and having values different from each other in the base band signal larger than a minimum value of a difference between instantaneous values of two points representing two symbols not including the redundant bit and different from each other.

* * * * *